United States Patent
Bonomi (10) Patent No.: US 11,906,996 B2
(45) Date of Patent: Feb. 20, 2024

(54) SYSTEM AND METHOD FOR DIGITAL FEEDBACK CIRCUIT AND ANALOG FEEDBACK CIRCUIT

(71) Applicant: Infineon Technologies AG, Neubiberg (DE)

(72) Inventor: Stefano Bonomi, Villach (AT)

(73) Assignee: Infineon Technologies AG, Neubiberg (DE)

( * ) Notice: Subject to any disclaimer, the term of this patent is extended or adjusted under 35 U.S.C. 154(b) by 182 days.

(21) Appl. No.: 17/348,252

(22) Filed: Jun. 15, 2021

(65) Prior Publication Data
US 2022/0397926 A1 Dec. 15, 2022

(51) Int. Cl.
*H03M 1/12* (2006.01)
*G05F 1/575* (2006.01)

(52) U.S. Cl.
CPC ............. *G05F 1/575* (2013.01); *H03M 1/12* (2013.01)

(58) Field of Classification Search
CPC ... G05F 1/10; G05F 1/267; G05F 1/46; G05F 1/561; G05F 1/567; G05F 1/569; G05F 1/571; G05F 1/573; G05F 1/5735; G05F 1/461; G05F 1/462; G05F 1/463; G05F 1/465; G05F 1/466; G05F 1/467; G05F 1/56; G05F 1/562; G05F 1/563; G05F 1/565; G05F 1/575; G05F 1/577; G05F 1/585; G05F 1/59; G05F 1/595; G05F 1/607; G05F 1/61; G05F 1/613; G05F 1/614; G05F 1/618; G05F 1/62; G05F 1/66; G05F 1/08; G05F 1/153; G05F 1/16; G05F 1/26; G05F 1/34; G05F 3/02; G05F 3/30; G05F 3/22; G05F 3/222; G05F 3/242; G05F 3/225; G05F 3/245; G05F 3/20; G05F 3/00; G05F 3/08; G05F 3/10; G05F 3/16; G05F 3/18; G05F 3/185; G05F 3/227; G05F 3/247; G05F 3/26; G05F 3/265; G05F 3/24; G05F 3/262
See application file for complete search history.

(56) References Cited

U.S. PATENT DOCUMENTS

| | | |
|---|---|---|
| 6,580,261 B1 | 6/2003 | Dow |
| 6,856,124 B2 | 2/2005 | Dearn et al. |

(Continued)

OTHER PUBLICATIONS

Akram, Muhammad Abrar et al., "Architectural Advancement of Digital Low-Dropout Regulators", Journals & Magazine Published in: IEEE Access, vol. 8, Jul. 28, 2020, 18 pages.

(Continued)

*Primary Examiner* — Bryan R Perez
(74) *Attorney, Agent, or Firm* — Slater Matsil, LLP (57) ABSTRACT

In accordance with an embodiment, a circuit includes: a pass transistor drive circuit including an digital input, and at least one output configured to be coupled to at least one pass transistor; a digital feedback circuit having a first analog input configured to be coupled to the at least one pass transistor, and a digital output coupled to the digital input of the pass transistor drive circuit; and an analog feedback circuit including a second analog input configured to be coupled to the at least one pass transistor, and an analog output coupled to an over voltage node of the pass transistor drive circuit, where the analog feedback circuit has a DC gain greater than zero.

18 Claims, 7 Drawing Sheets

(56) References Cited

U.S. PATENT DOCUMENTS

| | | | |
|---|---|---|---|
| 7,098,720 | B1 | 8/2006 | Dow |
| 7,253,595 | B2 | 8/2007 | Oddoart et al. |
| 7,495,501 | B2 * | 2/2009 | Iwabuchi ............... H02M 3/07 |
| | | | 363/59 |
| 8,344,713 | B2 | 1/2013 | Shrivas et al. |
| 8,575,905 | B2 | 11/2013 | Bulzacchelli et al. |
| 10,056,828 | B2 | 8/2018 | Morici |
| 2008/0180080 | A1 | 7/2008 | Terry et al. |
| 2015/0346749 | A1 * | 12/2015 | Bernardon ............... G05F 1/575 |
| | | | 323/274 |
| 2016/0352217 | A1 * | 12/2016 | Reddy ..................... H02M 1/08 |
| 2017/0063223 | A1 * | 3/2017 | Raghupathy ............. G05F 1/56 |
| 2022/0137655 | A1 * | 5/2022 | Ray ......................... G05F 1/565 |
| | | | 323/282 |

OTHER PUBLICATIONS

Chen, Jiann-Jong et al., "A Capacitor-free-fast-transient-response LDO with dual-loop controlled paths", http://www.researchgate.net/publication/4308501, Dec. 2007, 6 pages.

Deleuran, Alexander et al., "A Capacitor-Free, Fast Transient Response Linear Voltage Regulator in a 180nm CMOS", DTU Library, Proceedings of NORCAS 2015, Oct. 26-28, 2015, 5 pages.

Huang, Mo et al., "A Fully Integrated Digital LDO With Coarse Fine-Tuning and Burst-Mode Operation", IEEE Transactions on Circuits and Systems II: Express Briefs, vol. 63, Issue: 7, Jul. 2016, 5 pages.

Huang, Mo et al., "An Analog-Proportional Digital-Integral Multi-Loop Digital LDO with Fast Response, Improved PSR and Zero Minimum Load Current", IEEE Custom Integrated Circuits Conference (CICC), Apr. 14-17, 2019, 4 pages.

Huang, Mo et al., "An output-capacitor-free analog-assisted digital low-dropout regulator with tri-loop control", IEEE International Solid-State Circuits Conference (ISSCC), Session 20, 20.4, Feb. 8, 2017, 3 pages.

Huang, Mo et al., "An Overview of Digital Low Drop-out Regulator Design", IEEE Asia Pacific Conference on Circuits and Systems (APCCAS), Oct. 26-30, 2018, 4 pages.

Huang, Mo et al., "Limit Cycle Oscillation Reduction for Digital Low Dropout Regulators", IEEE Transactions on Circuits and Systems II: Express Briefs, vol. 63, Issue 9, Sep. 2016, 5 pages.

Huang, Mo et al., "Review of Analog-Assisted-Digital and Digital-Assisted-Analog Low Dropout Regulators", IEEE Journals & Magazine IEEE Transactions on Circuits and Systems II: Express Briefs, vol. 68, Issue 1, Jan. 2021, 6 pages.

Lee, Yong-Jin et al., "A 200-mA Digital Low Drop-Out Regulator With Coarse-Fine Dual Loop in Mobile Application Processor", IEEE Journal of Solid-State Circuits, vol. 52, No. 1, Jan. 2017, 13 pages.

Ma, Xiaofei "A 0.4V 430nA Quiescent Current NMOS Digital LDO with NAND-Based Analog-Assisted Loop in 28nm CMOS", IEEE International Solid-State Circuits Conference—(ISSCC), Session 18, 18.4, Feb. 14, 2018, 3 page.

Manda, Mahender et al., "A Multi-Loop Low-Dropout FVF Voltage Regulator with Enhanced Load Regulation", IEEE 60th International Midwest Symposium on Circuits and Systems (MWSCAS), Aug. 6-9, 2017, 4 pages.

Milliken, Robert Jon, "A Capacitor-Less Low Drop-Out Voltage Regulator With Fast Transient Response", A Thesis, Texas A&M University, Dec. 2005, 106 pages.

Nasir, Saad Bin et al., "Switched-Mode-Control Based Hybrid LDO for Fine-Grain Power Management of Digital Load Circuits", IEEE Journal of Solid-State Circuits, vol. 53, No. 2, Feb. 2018, 13 pages.

Nasir, Saad Bin et al., "On Limit Cycle Oscillations in Discrete-Time Digital Linear Regulators", IEEE Applied Power Electronics Conference and Exposition (APEC), Mar. 15-19, 2015, 6 pages.

Richtek, "600mA, Ultra-Fast Transient Response Linear Regulator", RT 9166B, DS9166B-01, Apr. 2011, 9 pages.

Rincon-Mora, Gabriel Alfonso "Current Efficient, Low Voltage, Low Drop-Out Regulators", A Thesis, Georgia Institute of Technology, Nov. 1996, 198 pages.

Texas Instruments, "Technical Review of Low Dropout Voltage Regulator Operation and Performance", Application Report, Aug. 1999, 30 pages.

Yosef-Hay, Yoni et al., "Fully Integrated, Low Drop-Out Linear Voltage Regulator in 180 nm CMOS", Analog Integrated Circuits and Signal Processing, 92, Jul. 1, 2017, 15 pages.

Zhang, Hongda, "A High-Accuracy Digital Low-Dropout Regulator with Limit Cycle Oscillation Reduction Technique", IEEE International Conference on Integrated Circuits, Technologies and Applications, Nov. 2019, 2 pages.

* cited by examiner

SYSTEM AND METHOD FOR DIGITAL FEEDBACK CIRCUIT AND ANALOG FEEDBACK CIRCUIT

TECHNICAL FIELD

The present invention relates generally to a system and method for a circuit, and, in particular embodiments, to a system and method for a digital feedback circuit and an analog feedback circuit.

BACKGROUND

As the feature size of semiconductor fabrication technology continues to shrink, more circuits can be implemented on a single chip. However, as circuit density increases, parasitic coupling between on-chip components becomes more prominent. One way to mitigate performance degradation caused by parasitic coupling is to partition the circuit into multiple power domains and regulate the supply voltages of sensitive power domains using on-chip power supply regulator circuits, such as low dropout (LDO) regulators. Such LDO regulators generally include a pass transistor coupled between a higher voltage power supply and a lower voltage power supply regulated via a feedback loop. Some integrated circuits may include multiple LDO regulator circuits to provide a number of local regulated power supply domains.

Traditionally, the design of LDO regulators involves using a number of analog components that cannot take full advantage of the reduction of feature sizes as digital components. Analog amplifiers often require non-minimum size transistors and large capacitors in order to meet performance requirements. Recently, LDO regulators have been implemented using digital feedback loops. However, many digital implementations are prone to limit cycle and quantization level induced supply ripple, and have a poor power supply rejection ratio (PSRR) as compared to analog LDO regulators. Hybrid LDO regulators that incorporate a digital control loop for voltage control and an analog control loop for transient suppression have also been used. However, many Hybrid LDO regulator designs present challenges with respect to physical size and low voltage operation.

SUMMARY

In accordance with an embodiment, a circuit includes: a pass transistor drive circuit including an digital input, and at least one output configured to be coupled to at least one pass transistor; a digital feedback circuit having a first analog input configured to be coupled to the at least one pass transistor, and a digital output coupled to the digital input of the pass transistor drive circuit; and an analog feedback circuit including a second analog input configured to be coupled to the at least one pass transistor, and an analog output coupled to an over voltage node of the pass transistor drive circuit, where the analog feedback circuit has a direct current (DC) gain greater than zero.

In accordance with another embodiment, a method includes: controlling an output voltage of a low-dropout (LDO) regulator using a digital control loop including: digitizing the output voltage of the LDO regulator, and activating at least one pass transistor based on the digitized output voltage using a drive circuit; and controlling the output voltage of the LDO regulator using a nested analog control loop including: amplifying the output voltage of the LDO regulator according to a transfer function having a non-zero DC gain, and applying the amplified output voltage to an over voltage node of the drive circuit.

In accordance with a further embodiment, a voltage regulator includes: an analog-to-digital converter having an input coupled to an output node of the voltage regulator; a digital filter coupled to an output of the analog-to-digital converter; a drive circuit coupled to an output of the digital filter; a plurality of pass transistors having control nodes coupled to corresponding outputs of the drive circuit, and output nodes coupled to the output node of the voltage regulator; and an analog feedback circuit including an amplifier having an input coupled to the output node of the voltage regulator, and an output coupled to an over voltage node of the drive circuit, where the analog feedback circuit has a non-zero DC gain.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In an embodiment, an LDO regulator includes a digital loop and a nested analog control loop. The digital loop includes a digital filter that filters a digital error signal representing a difference between a desired set-point of the LDO regulator and a measured output voltage. The filtered digital error signal is provided to one or more driver circuits that are coupled to the control node of one or more series pass transistors. The nested analog control loop includes a bias circuit that adjusts the over voltage supplied to the control node of the pass transistor (or to a driver circuit that is coupled to the control node of the pass transistor) by adjusting power supply voltage provided to the driver circuits in accordance with the output voltage of the LDO regulator. During operation, the nested analog control loop advantageously attenuates ripple caused by limit cycles generated by the digital loop or caused by load activity, and increases the PSRR of the LDO regulator. In some embodiments, the bias circuit is advantageously implemented in a compact manner. For example, in some embodiments, the bias circuit has a non-zero DC gain and may be DC coupled to the output of the LDO without the need for a large alternating current (AC) coupling capacitor.

Figure 1A:
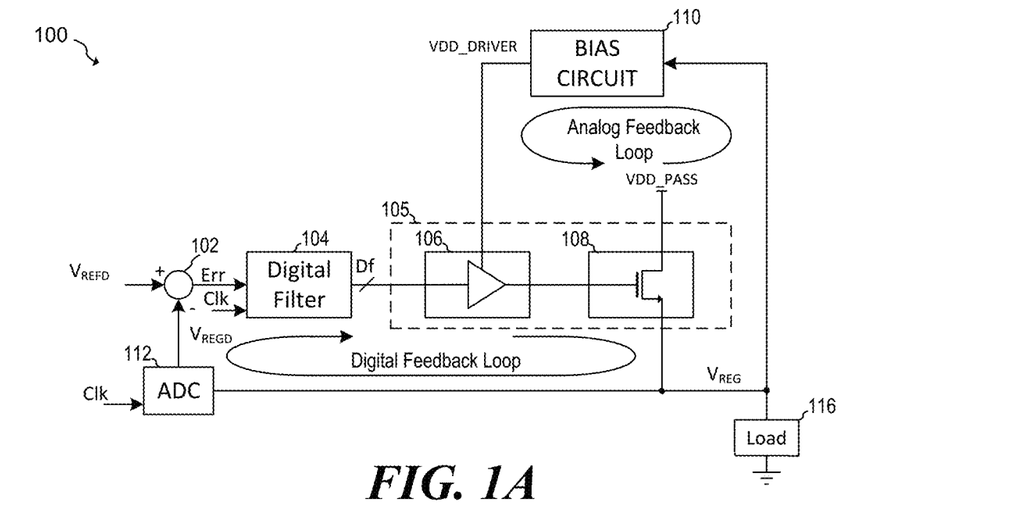
FIG. 1A illustrates a schematic of an LDO regulator according to an embodiment of the present invention.

FIG. 1A illustrates an LDO regulator 100 according to an embodiment of the present invention. As shown, LDO regulator 100 includes a digital feedback loop that includes digital subtractor 102, digital filter 104, an output stage 105 that includes driver circuit 106 (also referred to as a digitally controllable drive stage or a pass transistor drive circuit), and one pass transistor 108, and analog-to-digital converter (ADC) 112. In some embodiments, output stage 105 varies the strength of pass transistor 108 according to digital input word Df, as is explained in embodiments below. For example, driver circuit 106 may include a plurality of driver circuits 106 coupled to a corresponding plurality of pass transistors 108. Each driver circuit/pass transistor combination may be activated according to digital input word Df to provide a digitally selectable driver strength. LDO regulator 100 further includes a nested analog feedback loop that is formed by bias circuit 110, driver circuit 106 and pass transistor 108. Bias circuit 110 may be referred to as an analog feedback circuit.

As shown LDO regulator 100 is connected to load 116, which may represent any active or passive load that receives output voltage $V_{REG}$. For example, load 116 may represent an on-chip circuit that receives its power from LDO regulator 100. In some embodiments, load 116 may include a circuit, such as a clocked digital logic circuit, that generates current transients that have a propensity to cause voltage disturbances on output voltage $V_{REG}$.

The digital feedback loop regulates output voltage $V_{REG}$ by digitizing output voltage $V_{REG}$ via ADC 112 to form digitized output voltage $V_{REGD}$. Error signal Err is formed by subtracting digitized output voltage $V_{REGD}$ from a digitized setpoint voltage $V_{REGD}$, and is filtered using digital filter 104 to form digital output word Df. Digital filter 104 may be implemented using digital filter transfer functions and digital filter circuits known in the art. For example, digital filter 104 may be an integrator that is physically implemented as an accumulator. Alternatively, digital filter 104 may be infinite impulse response (IIR) lowpass filter or a finite impulse response (FIR) lowpass filter that is physically implemented using digital filter topologies and circuits (e.g. registers, accumulators, summing circuits, programmable DSP components) known in the art. Some portions of the digital feedback loop, such as ADC 112, digital filter 104, and optionally digital subtractor 102 (in embodiments in which the subtraction is performed in the digital domain) may be referred to as a "digital feedback circuit."

The strength of pass transistor 108 is varied according to digital output word Df. Thus, when output voltage $V_{REG}$ decreases (e.g. because of increased current sourced by load 116), the digital feedback loop increases the strength of pass transistor 108 in response, which causes a corresponding increase in output voltage $V_{REG}$. On the other hand, when output voltage $V_{REG}$ increases (e.g. because of decreased current sourced by load 116), the digital feedback loop decreases the strength of pass transistor 108 in response, which causes a corresponding decrease in output voltage $V_{REG}$.

Figure 1B:
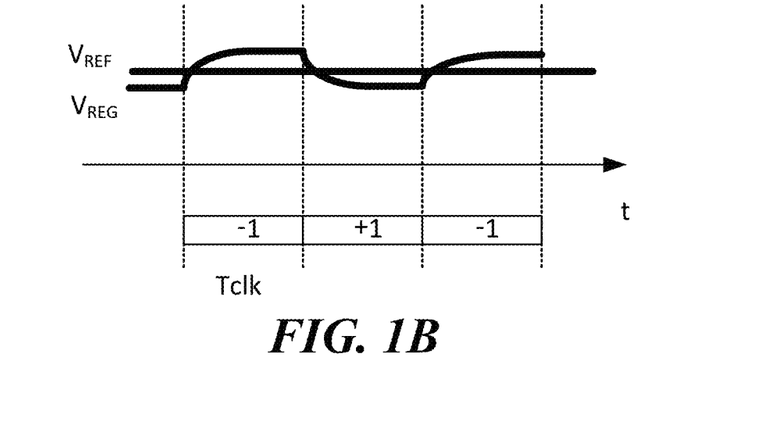
FIG. 1B illustrates a waveform diagram illustrating voltage ripple in an LDO regulator having a digital control loop.

Because the strength of pass transistor 108 is quantized according to digital output word, Df, voltage $V_{REG}$ exhibits quantization induced ripple or limit cycles, as shown in FIG. 1B, which illustrates a plot showing output voltage $V_{REG}$ and desired output voltage $V_{REF}$ with respect to time t, and the state of each period Tclk of clock signal Clk. The state of each period Tclk is designated by labels "−1," "+1," and "−1" in the diagram. In some cases, additional ripple may be caused by transient activity of load 116. It can be seen that output voltage $V_{REG}$ increases and decreases in an alternating fashion at each period Tclk of clock signal Clk used to clock ADC 112 and digital filter 104. For example, in the first and third clock cycles shown in FIG. 1B, output voltage $V_{REG}$ is greater than desired output voltage $V_{REF}$, while in the second cycle output voltage $V_{REG}$ is lower than desired output voltage $V_{REF}$. It should be understood that the voltage pattern exhibited by $V_{REG}$ in FIG. 1B is just one of many examples of how output voltage $V_{REG}$ may vary at each cycle of clock signal Clk. Output voltage $V_{REG}$ may exhibit more complex patterns and/or limit cycles depending on the implementation of the particular LDO regulator and its load 116. In addition, the digital feedback loop may be slow to correct fast transient induced errors in output voltage $V_{REG}$.

Conventional systems have addressed quantization induced ripple in a variety of ways. For example, ripple may be attenuated by adding additional output capacitance and/or by increasing the sampling frequency of the digital LDO regulator. However, increasing output capacitance may cause a corresponding increase in power consumption and total area used by the voltage regulator circuit. Another conventional method of decreasing ripple is increasing the digital resolution of output stage 105, for example, by increasing the resolution of the digital signal path, for example, by increasing the resolution of ADC 112 and digital filter 104, and by increasing the number of parallel pass transistors 108. However, increasing the resolution of the digital signal path may increase the size, complexity and power consumption of the voltage regulator circuit. For example, the size of the circuit may increase because of the increased width of the digital bus. In some cases, the length of one or more pass transistors corresponding to the least significant bits of the digital bus are increased in order to reduce the current step (due to the minimum width supported by the particular semiconductor process).

In embodiments of the present invention, a nested analog control loop works in conjunction with the digital feedback loop and attenuates quantization induced ripple, load activity induced ripple, limit cycles induced ripple, and transient induced disturbances. During operation, bias circuit 110 monitors output voltage $V_{REG}$ and adjusts the voltage provided to the supply node VDD_DRIVER (also referred to as the "over voltage node") of driver circuit 106. In various embodiments, the voltage at supply node VDD_DRIVER is applied to the gate node of pass transistor 108 (or to the gate nodes of activated pass transistors 108 in embodiments that implement pass transistor 108 as a plurality of digitally selectable pass transistors). The gate node of pass transistor 108 may also be referred to as a "control node" or a "drive node." During operation, an increase in the output voltage $V_{REG}$ causes bias circuit 110 to decrease the voltage of over voltage node VDD_DRIVER. This decrease in the voltage of over voltage node VDD_DRIVER is coupled from the gate to the source of pass transistor 108 and causes a corresponding decrease in output voltage $V_{REG}$. On the other hand, a decrease in the output voltage $V_{REG}$ causes bias circuit 110 to increase the voltage of over voltage node VDD_DRIVER. This increase in the voltage of over voltage node VDD_DRIVER is coupled from the gate to the source of pass transistor 108 and causes a corresponding increase in output voltage $V_{REG}$. In other words, the current step caused by a change in the output code of digital input word Df is reduced by reducing the overdrive of pass transistor 108 provided via its gate. In contrast, the power supply voltage (e.g. VDD_PASS) is applied to the gate of the pass transistor in conventional digital LDO regulator implementations.

In some embodiments, the bandwidth of the analog feedback loop is greater than the bandwidth of the digital feedback loop. The bandwidth of the analog feedback loop may be selected to be sufficient to attenuate and counteract fast transients, power supply disturbances, and ripple caused by quantization and limit cycles generated by the digital feedback loop. In some embodiments, the bandwidth of the analog feedback loop is between about 0 Hz and about 500 MHz, and is greater than the bandwidth of the digital feedback loop; however, values outside of this range could be used depending on the particular system and its implementation. As will be explained in example below, the analog feedback loop may be configured to have a DC gain, and may be designed in a manner that advantageously does not require the use of an AC coupling capacitor. By omitting an AC coupling capacitor in the analog feedback loop, LDO regulator 100 may be implemented using less silicon area.

Figure 1C:
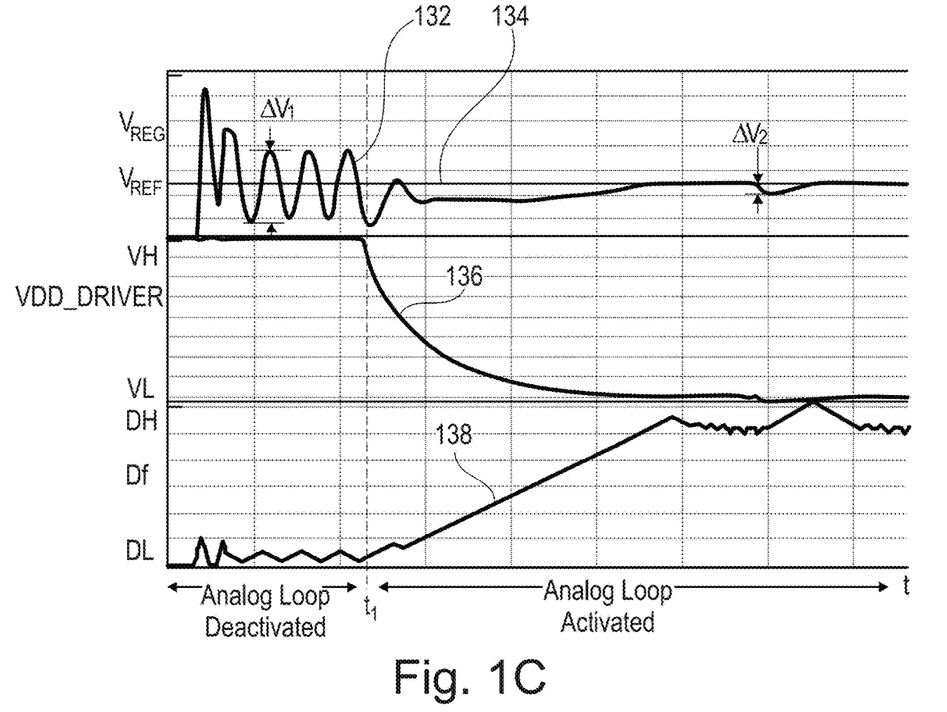
FIG. 1C illustrates a waveform diagram showing the operation of the LDO regulator illustrated in FIG. 1A.

FIG. 1C illustrates a waveform diagram of a circuit simulation of LDO regulator 100 that compares the performance of LDO regulator when the analog feedback loop is deactivated (prior to time $t_1$) and activated (after time $t_1$). As shown, trace 132 represents output voltage $V_{REG}$, trace 134 represents the desired output voltage $V_{REF}$ (represented by its digital version $V_{REFD}$ in FIG. 1A), trace 136 represents the voltage at over voltage node VDD_DRIVER, and trace 138 represents the digital input word Df provided to output stage 105 by digital filter 104.

When the analog feedback loop is deactivated prior to time $t_1$, the voltage 136 of over voltage node VDD_DRIVER has an initial voltage VH that may correspond, for example, to a local power supply voltage suppled to bias circuit 110; and digital input word Df starts at a low value DL that corresponds to the digital value necessary to cause output voltage $V_{REF}$ to have an average value of desired output voltage $V_{REF}$. It can be seen that output voltage $V_{REG}$ (trace 132) shows significant voltage ripple of $\Delta V_1$ prior to when the nested analog control loop is activated at time $t_1$. This ripple is induced, for example, by limit cycles that occur within the digital feedback loop. Ripple may also be induced by load activity, such as transient currents generated by load 116.

When the analog feedback loop is activated at time $t_1$, voltage 136 of over voltage node VDD_DRIVER decreases from voltage VH to voltage VL in order to provide sufficient headroom for the analog feedback loop to operate (as explained further below). The value of digital input word Df increases from low value DL to a higher value DH in order to compensate for the changes in voltage at over voltage node VDD_DRIVER and once again force the average value of output voltage $V_{REG}$ to match desired voltage $V_{REF}$. The new voltage value VL for node VDD_DRIVER essentially becomes the new bias point for the nested analog control loop to compensate for variations on output voltage $V_{REG}$ due to load activity or supply activity. Because the analog feedback loop actively compensates for higher frequency disturbances of output voltage $V_{REG}$, the resulting voltage ripple $\Delta V_2$ is significantly reduced compared to $\Delta V_1$ when the analog feedback loop is disabled prior to time $t_1$. Voltage ripple is also reduced because reducing the overdrive voltage supplied to the gate pass transistor 108 reduces the current step due to changes in digital output word Df.

Figure 1D:
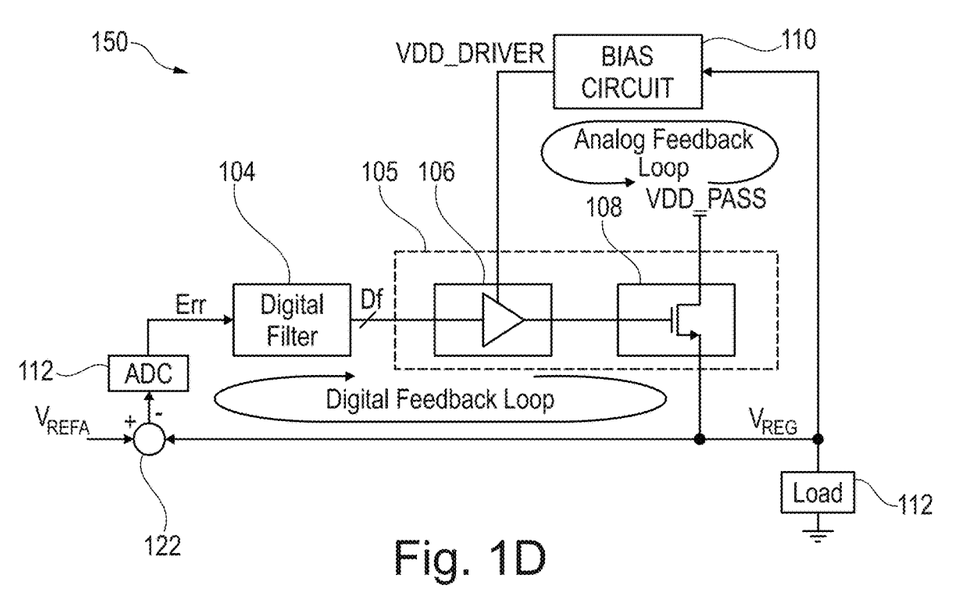
FIG. 1D illustrates an LDO regulator according to another embodiment.

While LDO regulator 100 illustrated in FIG. 1A generates error signal Err using a digital subtractor 102, an analog subtractor can also be used to in the generation of error signal Err in an alternative embodiment. FIG. 1D illustrates LDO regulator 150 in which error signal Err is generated by subtracting output voltage $V_{REG}$ from analog reference voltage $V_{REFA}$ in the analog domain using analog subtractor 122 (instead of using digital subtractor 102 shown in FIG. 1A). The output of analog subtractor 122 is digitized ADC 112 to form error signal Err. With the exception of using an analog subtractor 122 instead of a digital subtractor 102 and the relative location of ADC 112 within the digital feedback loop, the remaining circuitry of LDO regulator 150 shown in FIG. 1D is similar to LDO regulator 100 shown in FIG. 1A and operates in a similar manner.

In further alternative embodiments, the output voltage $V_{REG}$ may be divided using voltage divider (not shown) prior to its being subtracted from analog reference voltage $V_{REFA}$ with reference to the embodiment of FIG. 1D, or prior to its being digitized by ADC 112 with reference to the embodiment of FIG. 1A.

Figure 2A:
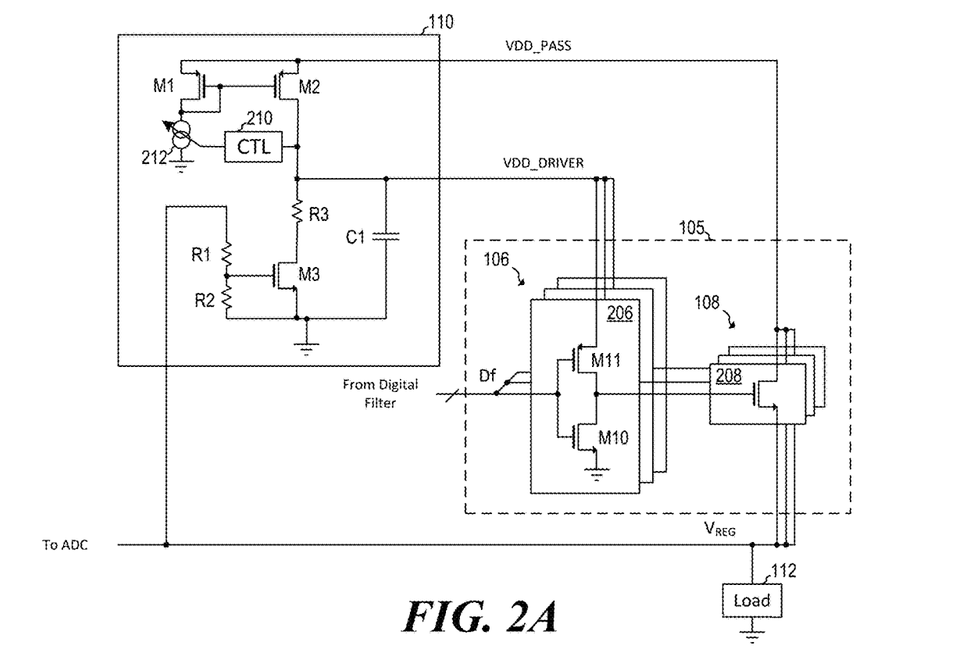
FIGS. 2A and 2B illustrate detailed views of a bias circuit and an output stage of an embodiment LDO regulator.
Figure 2B:
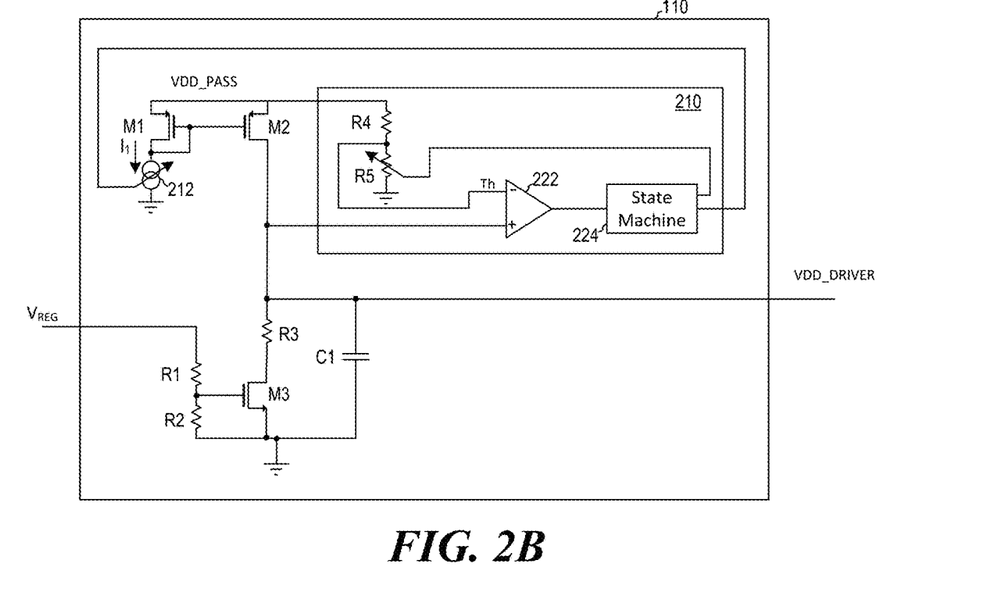
Figure 2C:
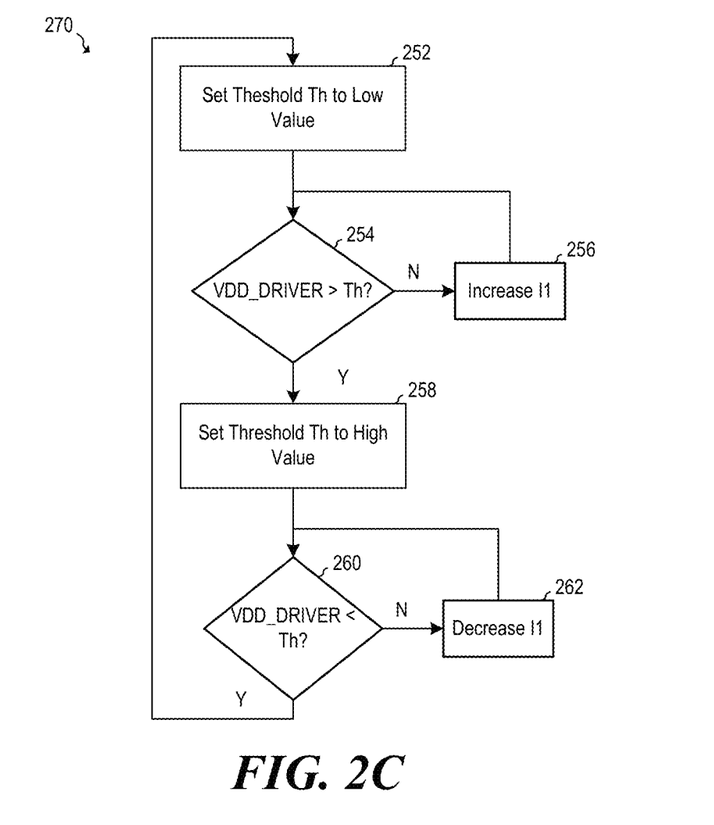
FIG. 2C illustrates a flow chart of an embodiment state machine.

FIGS. 2A-2C illustrate schematics of bias circuit 110 and output stage 105 according to an embodiment. FIG. 2A shows a more detailed view of a subsection of LDO regulator 100 or 150 (FIGS. 1A and 1D) that shows one embodiment implementation of bias circuit 110 and output stage 105. As shown, driver circuit 106 of output stage 105 includes a plurality of parallel driver circuits 206 that are connected to the gates of a corresponding plurality of pass transistors 208 that are included in pass transistor 208. In some embodiments, each driver circuit 206 is configured to be activated by a corresponding bit of digital input word Df. The width to length ratio of each corresponding pass transistor 208 is configured to correspond to the relative value of its corresponding bit in digital input word Df. For example, in one embodiment, the strength of each pass transistor 208 is binary weighted such that the pass transistor 208 corresponding to the most significant bit (MSB) of digital input word Df is twice as strong as the pass transistor 108 corresponding to the next most significant bit of digital input word Df. In some embodiments, pass transistors 208 may be constructed using unit size devices. In such an embodiment, the pass transistor 208 corresponding to the most significant bit of digital input word Df has twice the number of unit devices as the pass transistor 208 corresponding to the next more significant bit of digital input word Df. In some embodiments, at least a portion of driver circuits 206 and pass transistors 208 may be thermometer encoded in order to maintain monotonicity of the drive strength of output stage 105 at major code transitions of digital input word Df. Thermometer encoding may be implemented using a binary-to-thermometer encoder circuit (not shown) as known in the art.

As shown, driver circuits 206 are implemented using an inverter circuit that includes an NMOS transistor M10 and a PMOS transistor M11. However, it should be understood that the driver circuit depicted in FIG. 2A is just one example of many possible driver circuits that could be used. In alternative embodiments, driver circuits 206 may be implemented using other gate driver circuits known in the art.

As shown, bias circuit 110 is implemented using a common source amplifier coupled between output voltage node $V_{REG}$ and over voltage node VDD_DRIVER. More specifically, bias circuit 110 includes a voltage divider made up of resistors R1 and R2, the output of which is coupled to the gate of NMOS transistor M3 (also referred to as an "input transistor"). The output of NMOS transistor M3 is coupled to over voltage node VDD_DRIVER via resistor. A capacitor C1 is coupled between over voltage node VDD_DRIVER and the source of NMOS transistor M3 in order to provide adequate charge to driver circuit 106 during the switching of driver circuits 206. In some embodiments, capacitor C1 and/or the voltage divider may be omitted depending on the particular embodiments and its implementation.

As shown, transistor M3 is biased using a current generator that includes adjustable current source 212, and a current mirror made up of PMOS transistors M1 and M2. A current control circuit 210 may be used to set the current of adjustable current source 212 in order to keep the nominal voltage of over voltage node VDD_DRIVER within a predetermined voltage range based on measurement of the nominal voltage of over voltage node VDD_DRIVER. For example, on the one hand, when current control circuit 210 senses that the voltage at over voltage node VDD_DRIVER is too low, current control circuit 210 increases the current provided by current source 212. On the other hand, when current control circuit 210 senses that the voltage at over voltage node VDD_DRIVER is too high, current control circuit 210 decreases the current provided by current source 212.

It should be appreciated that the implementation of bias circuit 110 is just one example of many possible implementations. In alternative embodiments, other functionally equivalent circuits could be used. For example, one or more of MOS transistors M1, M2 and M3 may be implemented using other transistor types, such as bipolar junction transistors; the current source made of transistors M1 and M2 may be implemented using other current source types, such as a cascode current source; and/or an adjustable current source circuit may be directly connected to over voltage node VDD_DRIVER. In some embodiments, other amplifier topologies besides the common source amplifier implemented by transistor M3 could be used (e.g., a differential amplifier or an operational amplifier).

FIG. 2B illustrates a schematic of bias circuit 110 showing further details of current control circuit 210. As shown, current control circuit 210 includes a voltage divider having resistors R4 and R5, a comparator 222, and a state machine 224. During operation, comparator 222 compares the voltage at over voltage node VDD driver with the output of the voltage divider. Based on the result of this comparison, state machine 224 adjusts the current provided by current source 212. In some embodiments, state machine 224 may also adjust the division ratio of the voltage divider (e.g. by adjusting the value of resistor R4 and/or resistor R5) as described in further detail with respect to FIG. 2C.

Comparator 222 may be implemented using comparator circuits known in the art, and state machine 224 may be implemented using digital logic circuits known in the art. In some embodiments, state machine 224 may be implemented using a programmable processor. Alternatively, comparator 222 may be implemented using other types of circuits. For example, a window comparator that is made up of a first comparator that compares the voltage of over voltage node VDD_DRIVER to a first threshold, and a second comparator that compares the voltage of over voltage node VDD_DRIVER to a second threshold could be used. State machine 224 may be adapted to select a current for current source 212 that keeps the voltage of over voltage node VDD_DRIVER between these two thresholds. In some embodiments, state machine 224 may set the current of current source 212 when the embodiment LDO regulator is initialized, for example, at power up and leave the current of current source 212 constant during subsequent operation. Alternatively, state machine 224 may adjust the current of current source 212 on a periodic basis, for example, when the voltage of over voltage node VDD_DRIVER leaves its desired range of operation.

FIG. 2C illustrates a flow chart of an embodiment method 270 that may be implemented by state machine 224 (FIG. 2B). In various embodiments, method 270 is configured to adjust current I1 produced by current source 212 to cause the nominal voltage of node VDD_DRIVER to be between a low voltage threshold and a high voltage threshold. The high voltage threshold (at node Th) may be generated by the voltage divider made of resistors R4 and R5, for example, by state machine 224 causing an increase in the value of resistor R5; and the low voltage threshold (at node Th) may be generated by state machine 224 causing a decrease in the value of resistor R5. It should be understood that in alternative embodiments, the threshold voltage may be modified using other circuit techniques known in the art. For example, instead of modifying the value of the resistor R5, the value of resistor R4 may be modified. In another non-limiting example, a variable voltage threshold may be generated by varying the amount of current provided to a resistor. In some embodiments, the high voltage threshold and the low voltage threshold may be generated by separate dedicated voltage generation circuits, such as two separate voltage divider circuits.

In step 252, the threshold of comparator 222 is set to a low value. In some embodiments, this may be achieved by decreasing the value of resistor R5 in the voltage divider of current control circuit 210 shown in FIG. 2B. Reducing the value of resistor R5 increases the division ratio of the voltage divider and decreases the voltage at node Th.

Next, in step 254, the voltage of over voltage node VDD_DRIVER is compared with threshold Vth. If the voltage of over voltage node VDD_DRIVER is not greater than threshold Th, current I produced by current source 212 is increased in step 256. If the voltage of over voltage node VDD_DRIVER greater than threshold Th, operation of the state machine proceeds to step 258 in which the threshold Th is set to a high value. In some embodiments, this may be achieved by increasing the value of resistor $R_5$ in the voltage divider of current control circuit 210 shown in FIG. 2B. Increasing the value of resistor $R_5$ decreases the division ratio of the voltage divider and increases the voltage at node Th.

Next, in step 260, the voltage of over voltage node VDD_DRIVER is again compared to threshold Vth. If the voltage of over voltage node VDD_DRIVER is not less than threshold Th, current $I_1$ produced by current source 212 is decreased in step 262. However, if the voltage of over voltage node VDD_DRIVER less than threshold Th, operation of the state machine proceeds to back to step 252. In some embodiments, the operation of the state machine is stopped or paused prior to the execution of step 252.

FIGS. 3A-3D illustrate graphs that compare the performance of an embodiment LDO regulator that utilizes both a digital feedback loop and a nested analog control loop with a conventional LDO regulator that only utilizes a digital feedback loop.

Figure 3A:
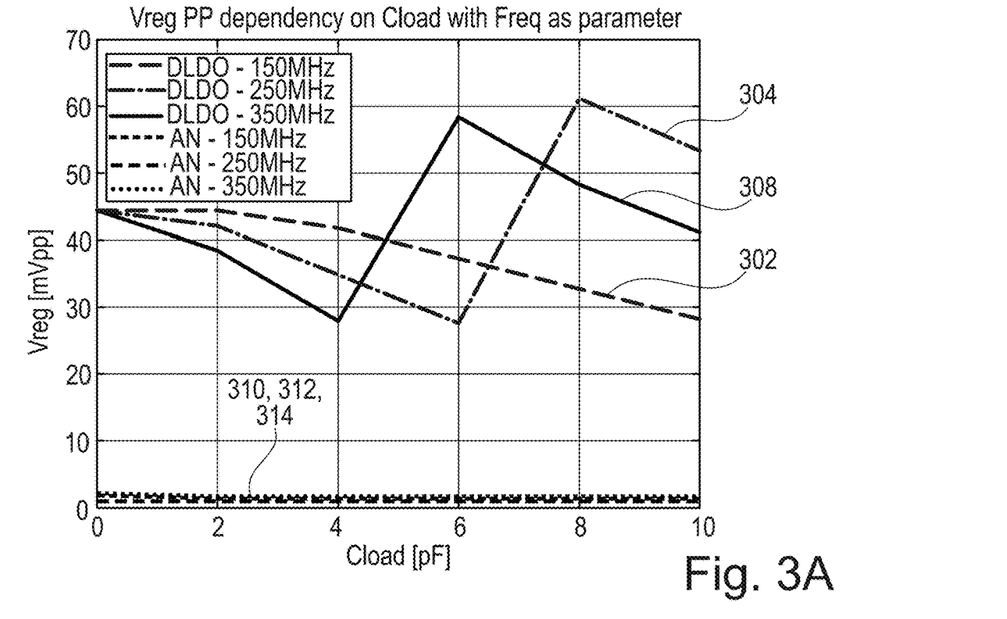
FIGS. 3A-3D illustrate graphs that compare the performance of an embodiment LDO regulator with a digital feedback loop and a nested analog feedback loop with the performance of a conventional LDO regulator with a digital feedback loop.

FIG. 3A illustrates a series of plots that compares the amount of peak-to-peak voltage ripple at output node $V_{REG}$ with respect to the capacitive load of the LDO regulator (e.g., the amount of capacitance to ground at output node $V_{REG}$)) for a conventional LDO regulator with a digital feedback loop and an embodiment LDO regulator with both a digital feedback loop and a nested analog control loop.

Traces 302, 304 and 308 represent the peak-to-peak voltage ripple for a conventional LDO with a digital feedback loop at frequencies of 150 MHz, 250 MHz and 350 MHz, respectively; and traces 310, 312 and 314 represent the peak-to-peak voltage ripple for an embodiment LDO regulator with a both a digital feedback loop and a nested analog control loop at frequencies of 150 MHz, 250 MHz and 350 MHz, respectively. It can be seen that the amount of peak-to-peak voltage ripple produced by the embodiment LDO regulator having both a digital feedback loop and a nested analog control loop is significantly less than the peak-to-peak voltage ripple produced by the conventional LDO regulator having only a digital feedback loop. This performance increase is especially apparent at higher frequencies and higher capacitive loads in which the peak-to-peak voltage ripple of the conventional LDO regulator sees a significant increase; however, the embodiment LDO regulator maintains a very low peak-to-peak voltage ripple.

Figure 3B:
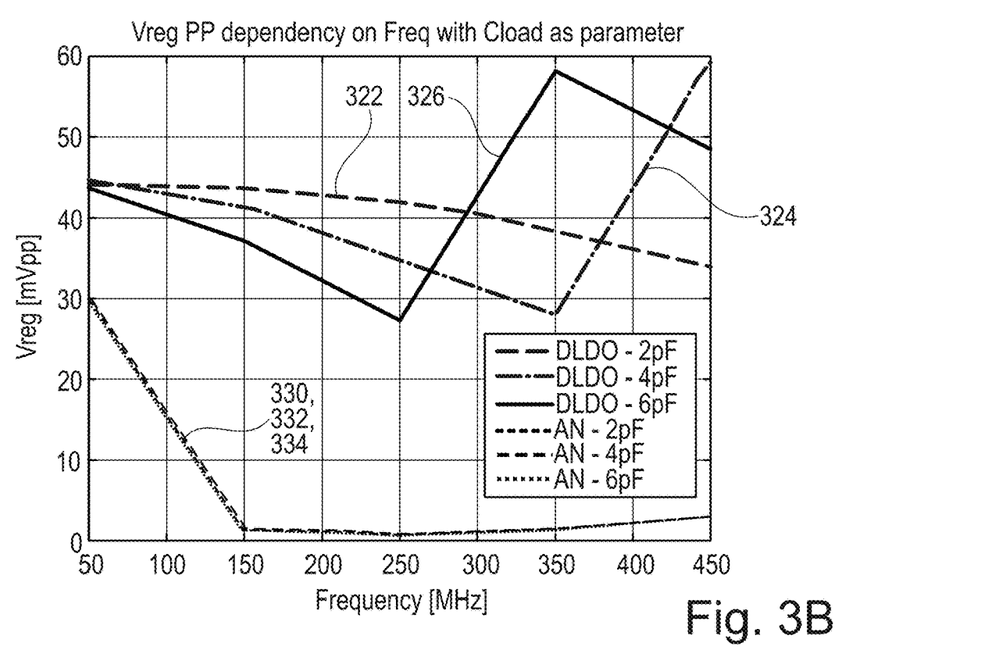

FIG. 3B illustrates a series of plots that compares the amount of peak-to-peak voltage ripple at output node $V_{REG}$ with respect to frequency for various capacitive loads and regulator configurations. Traces 322, 324 and 326 represent the peak-to-peak voltage ripple for a conventional LDO regulator with a digital feedback loop at capacitive loads of 2 pF, 4 pF and 6 pF, respectively; and traces 330, 332 and 334 represent the peak-to-peak voltage ripple for an embodiment LDO with a both a digital feedback loop and a nested analog control loop at capacitive loads of 2 pF, 4 pF and 6 pF, respectively. Again, it can be seen that the amount of peak-to-peak voltage ripple produced by the embodiment LDO regulator having both a digital feedback loop and a nested analog control loop is significantly less than the peak-to-peak voltage ripple produced by the conventional LDO regulator having only a digital feedback loop.

Figure 3C:
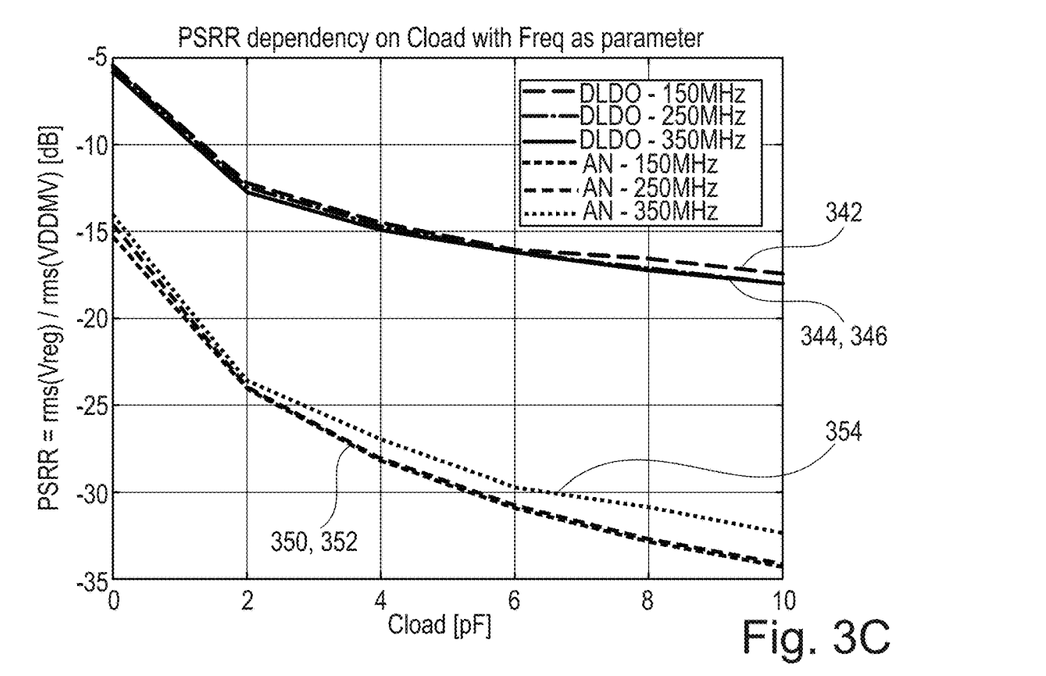

FIG. 3C illustrates a series of plots that compares the power supply rejection ratio (PSRR) measured at output node $V_{REG}$ with respect to the capacitive load of the LDO regulator (e.g., the amount of capacitance to ground at output node $V_{REG}$) for a conventional LDO regulator with a digital feedback loop and an embodiment LDO regulator with both a digital feedback loop and a nested analog control loop. Traces 342, 344 and 346 represent the PSRR for a conventional LDO with a digital feedback loop at frequencies of 150 MHz, 250 MHz and 350 MHz, respectively; and traces 350, 352 and 354 represent the PSRR for an embodiment LDO regulator with a both a digital feedback loop and a nested analog control loop at frequencies of 150 MHz, 250 MHz and 350 MHz, respectively. It can be seen that the amount of PSRR of the embodiment LDO regulator having both a digital feedback loop and a nested analog control loop is significantly better than the PSRR of the conventional LDO regulator having only a digital feedback loop.

Figure 3D:
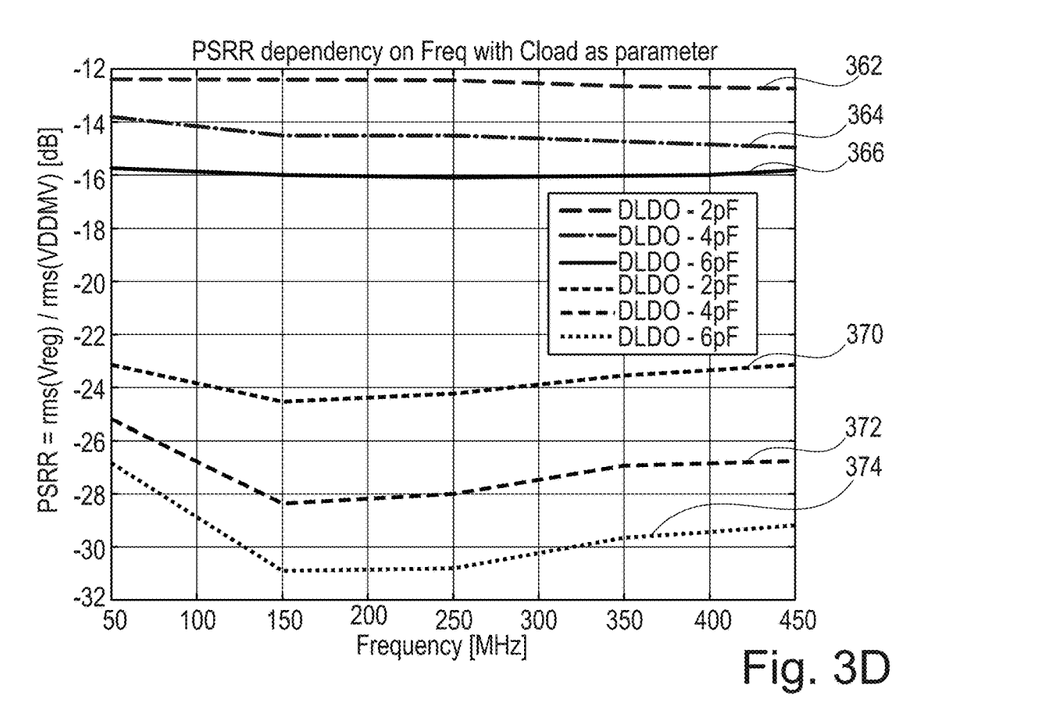

FIG. 3D illustrates a series of plots that compares the PSRR at output node $V_{REG}$ with respect to frequency for various capacitive loads and regulator configurations. Traces 362, 364 and 366 represent the PSRR for a conventional LDO regulator with a digital feedback loop at capacitive loads of 2 pF, 4 pF and 6 pF, respectively; and traces 370, 372 and 374 represent the PSRR for an embodiment LDO regulator with a both a digital feedback loop and a nested analog control loop at capacitive loads of 2 pF, 4 pF and 6 pF, respectively. Again, it can be seen that the PSRR of the embodiment LDO regulator having both a digital feedback loop and a nested analog control loop is significantly better than the PSRR of the conventional LDO regulator having only a digital feedback loop.

Figure 4:
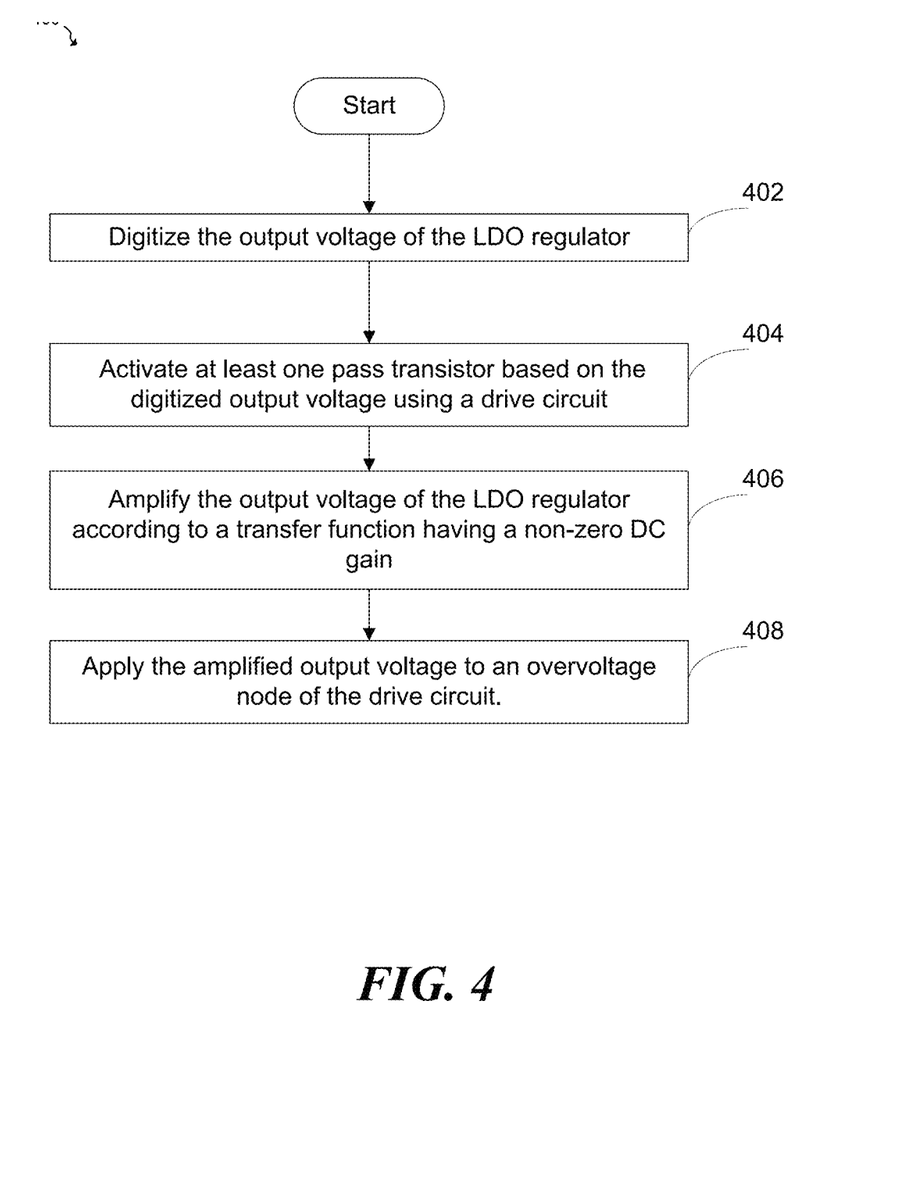
FIG. 4 illustrates a flowchart of a method according to an embodiment.

FIG. 4 illustrates a block diagram of a method 400 of operating an embodiment LDO regulator. Method 400 may be applied to any of the embodiment LDO regulators disclosed herein. Steps 402 and 404 are directed to controlling an output voltage of a low-dropout (LDO) regulator using a digital control loop. In step 402, the output voltage of the LDO regulator is digitized, and in step 404, at least one pass transistor is activated based on the digitized output voltage using a drive circuit. The output voltage may be digitized, for example, using an ADC, such as ADC 112 illustrated in FIGS. 1A and 1D; the at least one pass transistor may be a transistor, such as pass transistor 108 or 208 illustrated in FIGS. 1A, 1D and/or 2A; and the at least one drive circuit may be a drive circuit, such as drive circuit 106 and/or 206 illustrated in FIGS. 1A, 1D and/or 2A.

Steps 406 and 408 are directed to controlling the output voltage of the LDO regulator using a nested analog control loop. In step 406, the output voltage of the LDO regulator is amplified according to a transfer function having a non-zero DC gain, and in step 408, the amplified output voltage is applied to an over voltage node of the drive circuit. The amplifier may be implemented using, for example, a common source amplifier such as the common source amplifier implemented by transistor M3 illustrated in FIGS. 2A and 2B; and the over voltage node may be a power supply node to the drive circuit, such as over voltage node VDD_DRIVER shown in FIGS. 1A, 1D, 2A and 2B.

Embodiments LDO regulators may be implemented on an integrated circuit. For example, in some embodiments, the circuitry that comprise the LDO regulator may be disposed on a single semiconductor substrate, such as a silicon substrate. Alternatively, embodiment LDO regulators may be implemented using two or more integrated circuits and/or may be implemented using discrete components depending on the particular system and its requirements. In some embodiments, two or more LDO regulator circuits may be disposed on a single semiconductor substrate in order to provide power to two or more on-chip voltage domains.

Embodiments specifically described herein may be implemented using a complementary metal oxide semiconductor process (CMOS) that includes NMOS and PMOS devices. However, in alternative embodiments, other semiconductor processes and technologies could be used to implement embodiment LDO regulators. For example, a bipolar process could be used in which MOS transistors are replaced by bipolar junction transistors (BJTs) and/or a BiCMOS process could be used in which some or all of the MOS transistors are replaced by bipolar junction transistors. bipolar junction transistors.

Embodiments of the present invention are summarized here. Other embodiments can also be understood from the entirety of the specification and the claims filed herein.

Example 1. A circuit including: a pass transistor drive circuit including an digital input, and at least one output configured to be coupled to at least one pass transistor; a digital feedback circuit having a first analog input configured to be coupled to the at least one pass transistor, and a digital output coupled to the digital input of the pass transistor drive circuit; and an analog feedback circuit including a second analog input configured to be coupled to the at least one pass transistor, and an analog output coupled to an over voltage node of the pass transistor drive circuit, where the analog feedback circuit has a DC gain greater than zero.

Example 2. The circuit of example 1, further including the at least one pass transistor.

Example 3. The circuit of one of examples 1 or 2, where the pass transistor drive circuit includes a plurality of digitally controllable drive stages, where a power supply node of each of the plurality of digitally controllable drive stages is coupled to the over voltage node.

Example 4. The circuit of example 3, where each digitally controllable drive stage of the plurality of digitally controllable drive stages includes a first transistor coupled between the over voltage node and a drive node, and a second transistor coupled between the drive node and the power supply node.

Example 5. The circuit of one of examples 1 to 4, where the digital feedback circuit includes an analog-to-digital converter having an input coupled to the first analog input and a digital filter coupled to an output of the analog-to-digital converter.

Example 6. The circuit of one of examples 1 to 5, where the analog feedback circuit includes an amplifier having an input coupled the second analog input, and an output coupled to the over voltage node.

Example 7. The circuit of example 6, where the amplifier includes: a first transistor coupled to the second analog input; and a current source coupled to the over voltage node.

Example 8. The circuit of one of examples 6 and 7, where the amplifier further includes a voltage divider coupled between the second analog input and a control node of the first transistor.

Example 9. The circuit of one of examples 1 to 8, where the pass transistor drive circuit and the analog feedback circuit are disposed on a single semiconductor substrate.

Example 10. The circuit of one of examples 1 to 9, where the digital feedback circuit is further disposed on the single semiconductor substrate.

Example 11. A method including: controlling an output voltage of a low-dropout (LDO) regulator using a digital control loop including: digitizing the output voltage of the LDO regulator, and activating at least one pass transistor based on the digitized output voltage using a drive circuit; and controlling the output voltage of the LDO regulator using a nested analog control loop including: amplifying the output voltage of the LDO regulator according to a transfer function having a non-zero DC gain, and applying the amplified output voltage to an over voltage node of the drive circuit.

Example 12. The method of example 11, where the digital control loop has a smaller bandwidth than the nested analog control loop.

Example 13. The method of one of examples 11 or 12, where controlling the output voltage of the LDO regulator using the digital control loop further includes digitally filtering the digitized output voltage.

Example 14. The method of one of examples 11 to 13, where amplifying the output voltage of the LDO regulator using the nested analog control loop further includes using an amplifier loaded with a current source.

Example 15. The method of one of examples 11 to 14, further including: measuring a nominal voltage of the over voltage node; and setting a current of the current source based on the measured nominal voltage of the over voltage node.

Example 16. The method of one of examples 11 to 15, where activating the at least one pass transistor based on the digitized output voltage includes selectively activating a plurality of pass transistors based on the digitized output voltage.

Example 17. A voltage regulator including: an analog-to-digital converter having an input coupled to an output node of the voltage regulator; a digital filter coupled to an output of the analog-to-digital converter; a drive circuit coupled to an output of the digital filter; a plurality of pass transistors having control nodes coupled to corresponding outputs of the drive circuit, and output nodes coupled to the output node of the voltage regulator; and an analog feedback circuit including an amplifier having an input coupled to the output node of the voltage regulator, and an output coupled to an over voltage node of the drive circuit, where the analog feedback circuit has a non-zero DC gain.

Example 18. The voltage regulator of example 17, where a bandwidth of a first control loop including the digital filter is less than a bandwidth of a second control loop including the analog feedback circuit.

Example 19. The voltage regulator of one of examples 17 or 18, where the second control loop is configured to attenuate voltage ripple caused by limit cycles generated by the first control loop or caused by activity of a load coupled to the output node of the voltage regulator.

Example 20. The voltage regulator of one of examples 17 to 19, where: the amplifier includes an input transistor loaded by a current source; and a current control circuit configured to set a current of the current source according to a nominal voltage of the over voltage node.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising: a pass transistor drive circuit comprising an digital input, and at least one output configured to be coupled to at least one pass transistor; a digital feedback circuit having a first analog input configured to be coupled to the at least one pass transistor, and a digital output coupled to the digital input of the pass transistor drive circuit; and a continuous-time analog feedback circuit comprising a second analog input configured to be coupled to the at least one pass transistor, and an analog output coupled to an over voltage node of the pass transistor drive circuit, wherein the analog feedback circuit has a direct current (DC) gain greater than zero,
   wherein a bandwidth of a first control loop comprising the digital feedback circuit is less than a bandwidth of a second control loop comprising the analog feedback circuit.

2. The circuit of claim 1, wherein the pass transistor drive circuit comprises a plurality of digitally controllable drive stages, wherein a power supply node of each of the plurality of digitally controllable drive stages is coupled to the over voltage node.

3. The circuit of claim 2, wherein each digitally controllable drive stage of the plurality of digitally controllable drive stages comprises a first transistor coupled between the over voltage node and a drive node, and a second transistor coupled between the drive node and the power supply node.

4. The circuit of claim 1, wherein the analog feedback circuit comprises an amplifier having an input coupled the second analog input, and an output coupled to the over voltage node.

5. The circuit of claim 4, wherein the amplifier comprises: a first transistor coupled to the second analog input; and a current source coupled to the over voltage node.

6. The circuit of claim 5, wherein the amplifier further comprises a voltage divider coupled between the second analog input and a control node of the first transistor.

7. The circuit of claim 1, wherein the pass transistor drive circuit and the analog feedback circuit are disposed on a single semiconductor substrate.

8. The circuit of claim 7, wherein the digital feedback circuit is further disposed on the single semiconductor substrate.

9. The circuit of claim 1, further comprising the at least one pass transistor.

10. The circuit of claim 1, wherein the digital feedback circuit comprises an analog-to-digital converter having an input coupled to the first analog input and a digital filter coupled to an output of the analog-to-digital converter.

11. A method comprising:
controlling an output voltage of a low-dropout (LDO) regulator using a digital control loop comprising:
digitizing the output voltage of the LDO regulator, and
activating at least one pass transistor based on the digitized output voltage using a drive circuit; and
controlling the output voltage of the LDO regulator using a nested analog control loop comprising:
amplifying the output voltage of the LDO regulator according to a transfer function having a non-zero direct current (DC) gain, and
applying the amplified output voltage to an over voltage node of the drive circuit, wherein the digital control loop has a smaller bandwidth than the nested analog control loop.

12. The method of claim 11, wherein amplifying the output voltage of the LDO regulator using the nested analog control loop further comprises using an amplifier loaded with a current source.

13. The method of claim 12, further comprising:
measuring a nominal voltage of the over voltage node; and
setting a current of the current source based on the measured nominal voltage of the over voltage node.

14. The method of claim 11, wherein controlling the output voltage of the LDO regulator using the digital control loop further comprises digitally filtering the digitized output voltage.

15. The method of claim 11, wherein activating the at least one pass transistor based on the digitized output voltage comprises selectively activating a plurality of pass transistors based on the digitized output voltage.

16. A voltage regulator comprising: an analog-to-digital converter having an input coupled to an output node of the voltage regulator; a digital filter coupled to an output of the analog-to-digital converter; a drive circuit coupled to an output of the digital filter; a plurality of pass transistors having control nodes coupled to corresponding outputs of the drive circuit, and output nodes coupled to the output node of the voltage regulator; and a continuous-time analog feedback circuit comprising an amplifier having an input coupled to the output node of the voltage regulator, and an output coupled to an over voltage node of the drive circuit, wherein the analog feedback circuit has a non-zero direct current (DC) gain,
wherein a bandwidth of a first control loop comprising the digital filter is less than a bandwidth of a second control loop comprising the analog feedback circuit.

17. The voltage regulator of claim 16, wherein the second control loop is configured to attenuate voltage ripple caused by limit cycles generated by the first control loop or caused by activity of a load coupled to the output node of the voltage regulator.

18. The voltage regulator of claim 16, wherein:
the amplifier comprises an input transistor loaded by a current source; and
a current control circuit configured to set a current of the current source according to a nominal voltage of the over voltage node.

* * * * *